(12) United States Patent
Chen

(10) Patent No.: US 7,936,626 B2
(45) Date of Patent: May 3, 2011

(54) SENSE AMPLIFIER WITH A COMPENSATING CIRCUIT

(75) Inventor: Yin-Chang Chen, Hsin-Chu Hsien (TW)

(73) Assignee: eMemory Technology Inc., Hsinchu Science Park, Hsin-Chu (TW)

( * ) Notice: Subject to any disclaimer, the term of this patent is extended or adjusted under 35 U.S.C. 154(b) by 181 days.

(21) Appl. No.: 12/356,087

(22) Filed: Jan. 20, 2009

(65) Prior Publication Data
US 2010/0182861 A1  Jul. 22, 2010

(51) Int. Cl.
*G11C 7/02* (2006.01)
(52) U.S. Cl. .......................... 365/207; 36/189.07; 36/208
(58) Field of Classification Search .................. 365/207, 365/208, 189.07
See application file for complete search history.

(56) References Cited

U.S. PATENT DOCUMENTS

| 6,097,653 | A | * | 8/2000 | Park ............................. 365/207 |
| 6,212,124 | B1 | * | 4/2001 | Noda ....................... 365/230.06 |
| 7,099,204 | B1 | | 8/2006 | Wadhwa et al. |
| 7,170,790 | B2 | * | 1/2007 | Demange et al. ........ 365/185.21 |
| 7,512,026 | B2 | * | 3/2009 | O .................................. 365/207 |
| 7,710,782 | B2 | * | 5/2010 | Chen et al. ............... 365/185.21 |

* cited by examiner

*Primary Examiner* — Pho M Luu
(74) *Attorney, Agent, or Firm* — Winston Hsu; Scott Margo

(57) ABSTRACT

A sense amplifier for a memory includes a transistor, an operational amplifier, and a compensating circuit. The negative input end of the operational amplifier is coupled to the compensating circuit. The positive input end of the operational amplifier is coupled to the drain of the transistor. The output end of the operational amplifier is coupled to the gate of the transistor. The compensating circuit is coupled between the negative input end and the output end of the operational amplifier. The compensating circuit generates a compensating voltage to the negative input end of the operational amplifier according to the voltage of the gate of the transistor.

11 Claims, 3 Drawing Sheets

SENSE AMPLIFIER WITH A COMPENSATING CIRCUIT

BACKGROUND OF THE INVENTION

1. Field of the Invention

The present invention relates to a sense amplifier, and more particularly, to a sense amplifier with a compensating circuit.

2. Description of the Prior Art

In recent years, technology and applications of the flash memory have gradually been developed along with requirements of portable electronic products. These portable electronic products include film of a digital camera, a handheld electric device, a memory of a video game apparatus, a personal digital assistant (PDA), a telephone recorder, and a programmable IC, etc. The flash memory is the non-volatile memory, in which an operating principle is to control a switch of a gate channel to achieve an objective of memorizing data via changing a threshold voltage of a transistor or a memory cell so as to prevent data stored in the memory from disappearing due to disconnection with a power supply.

In general, the flash memory mainly includes a floating gate for storing electric charges, and a control gate disposed on the floating gate for controlling access of data, where the control gate is separated from the floating gate via a dielectric layer formed by an oxide-nitride-oxide (ONO) structure. Therefore, the memory can utilize a principle of thermal electrons or tunneling to store induced electric charges within the overlapped gates so as to store a signal '0' in the memory. If data stored in the memory needs to be changed, the only process is to supply a small extra amount of energy to remove electrons stored in the floating gate so as to rewrite data.

To access states of each memory cell in the memory, a sense amplifier is used to detect the induced electric charges stored in the memory cells so as to determine a value '0' or '1' that the memory cells represent. In general, the sense amplifier divides into a voltage mode and a current mode according to detecting types. For example, when a flash memory operates under a low voltage, the sense amplifier with the voltage mode cannot operate normally in such low voltage situations due to lower voltage swings. Therefore, the sense amplifier cannot exactly determine the storing state of the induced charges stored in the memory cells. Nevertheless, the sense amplifier using the current mode can be operated in the flash memory under the low voltage. The sense amplifier can obtain the storing state of the induced electric charges stored in the memory cells through an influence of current variance vs. voltage.

Please refer to FIG. 1. FIG. 1 is a diagram illustrating a conventional sense amplifier for a memory. The sense amplifier 100 includes an operational amplifier 101, a comparator 102, a reference current source 103, and four transistors M5, M6, M13, and M14. The transistors M13 and M14 are controlled by word lines ZWL and ZCL of the memory. The transistors M13 and M14 are PMOS transistors. The transistors M5 and M6 are NMOS transistors. The gate of the transistor M5 is coupled to the output end of the operational amplifier 101, and the drain of the transistor M5 is coupled to the positive input end of the operational amplifier 101. The transistor M5 and the operational amplifier 101 form a negative feedback loop so as to increase the stability of the sense amplifier 100. The drain of the transistor M5 is coupled to a bit line of the memory for receiving a current of the bit line. The comparator 102 compares a reference current Ir and the current of the bit line to determine a value that the memory cell represents.

However, the voltage drop is generated when the current of the bit line passing through the bit line load 104. Since the positive input end and the negative input end of the operational amplifier 101 are virtual short, the voltage at node A will be kept to the voltage VDL. Thus, the voltage VD will rise when the current of the bit line passing through the bit line load 104. That is, the voltage VD varies with the current of the bit line. In this way, the voltage VD has a variation when the data of the memory cell is read. The variation of the voltage VD decreases the current margin, which may causes the comparator 102 to generate an error signal.

SUMMARY OF THE INVENTION

The present invention provides a sense amplifier for a memory. The sense amplifier comprises a transistor, an operational amplifier, and a compensating circuit. The drain of the transistor is coupled to a bit line of the memory. The source of the transistor is coupled to the ground. The gate of the transistor is coupled to the compensating circuit. The negative input end of the operational amplifier is coupled to the compensating circuit. The positive input end of the operational amplifier is coupled to the drain of the transistor. The output end of the operational amplifier is coupled to the gate of the transistor. The compensating circuit is coupled between the negative input end and the output end of the operational amplifier, for generating a compensating voltage to the negative input end of the operational amplifier according to the voltage of the gate of the transistor.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
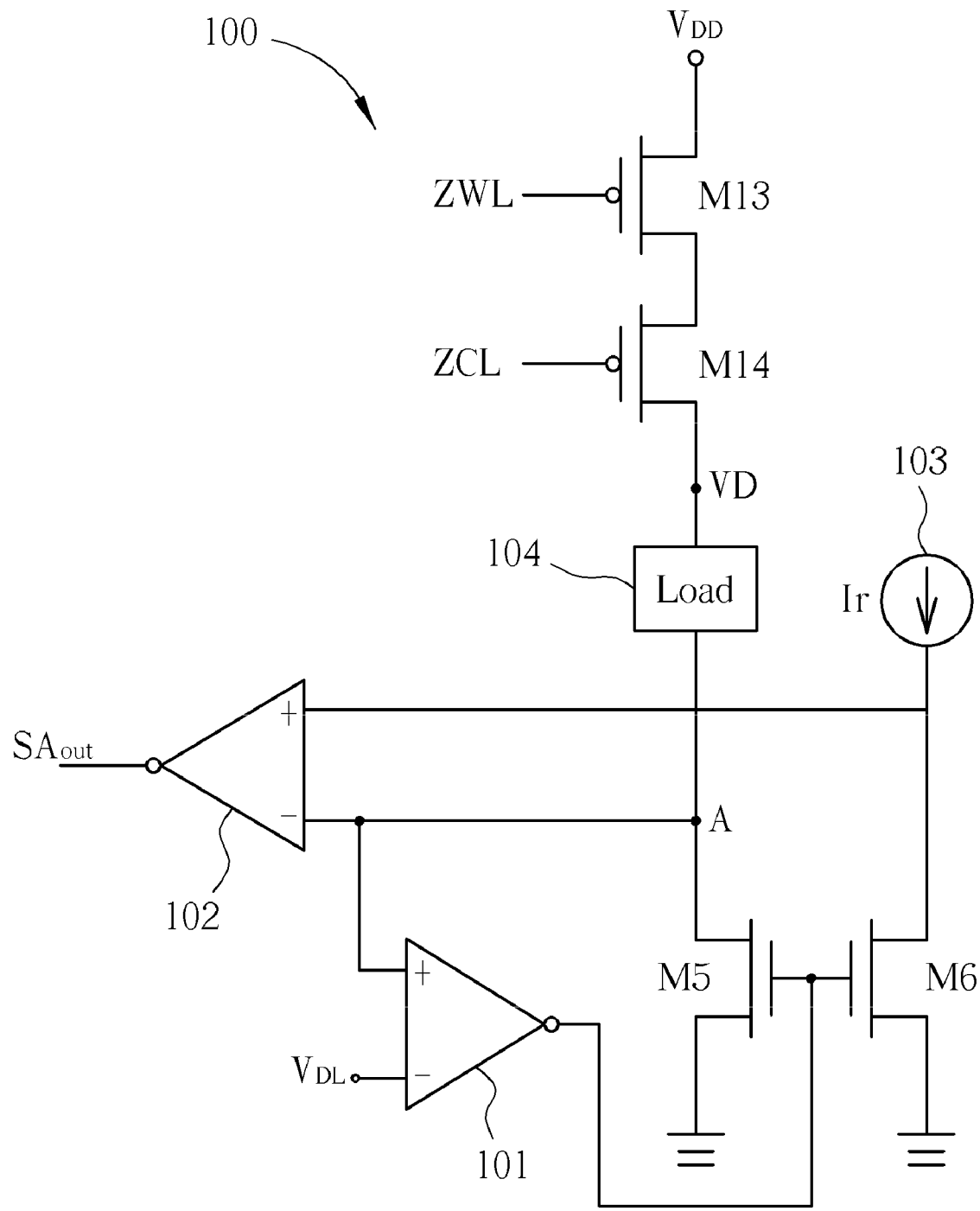
FIG. 1 is a diagram illustrating a conventional sense amplifier.
Figure 2:
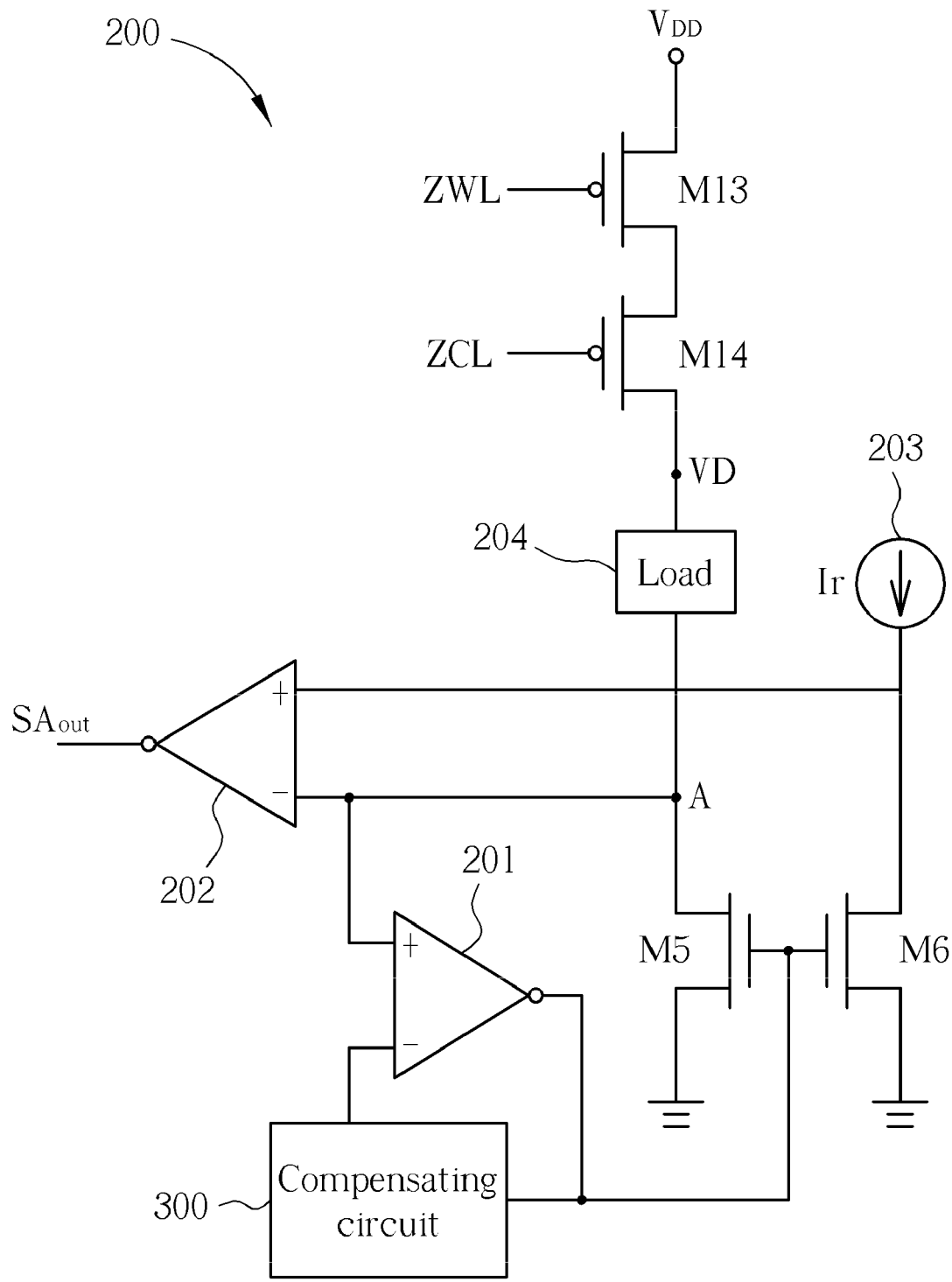
FIG. 2 is a diagram illustrating a sense amplifier according to the present invention.

Please refer to FIG. 2. FIG. 2 is a diagram illustrating a sense amplifier 200 for a memory according to the present invention. The sense amplifier 200 comprises an operational amplifier 201, a comparator 202, a reference current source 203, a compensating circuit 300, and four transistors M5, M6, M13, and M14. The transistors M5 and M6 are NMOS transistors. The transistors M13 and M14 are controlled by word lines ZWL and ZCL of the memory. The transistors M13 and M14 are PMOS transistors. The drain of the transistor M5 is coupled to a bit line of the memory. The gate of the transistor M5 is coupled to the compensating circuit 300. The source of the transistor M5 is coupled to the ground. The transistor M5 and the operational amplifier 201 form a negative feedback loop so as to increase the stability of the sense amplifier 200. The positive input end of the comparator 202 is coupled to the reference current source 203. The negative input end of the comparator 202 is coupled to positive input end of the operational amplifier 201. The gate of the transistor M6 is coupled to the gate of the transistor M5. The drain of the transistor M6 is coupled to the positive input end of the comparator 202. The source of the transistor M6 is coupled to the ground. The comparator 202 compares a reference current Ir and the current of the bit line to determine a value that the memory cell represents. However, a voltage drop is generated when the current of the bit line passing through the bit line load 204. Thus, the compensating circuit 300 can generate a compensating voltage to compensate the voltage drop.

Figure 3:
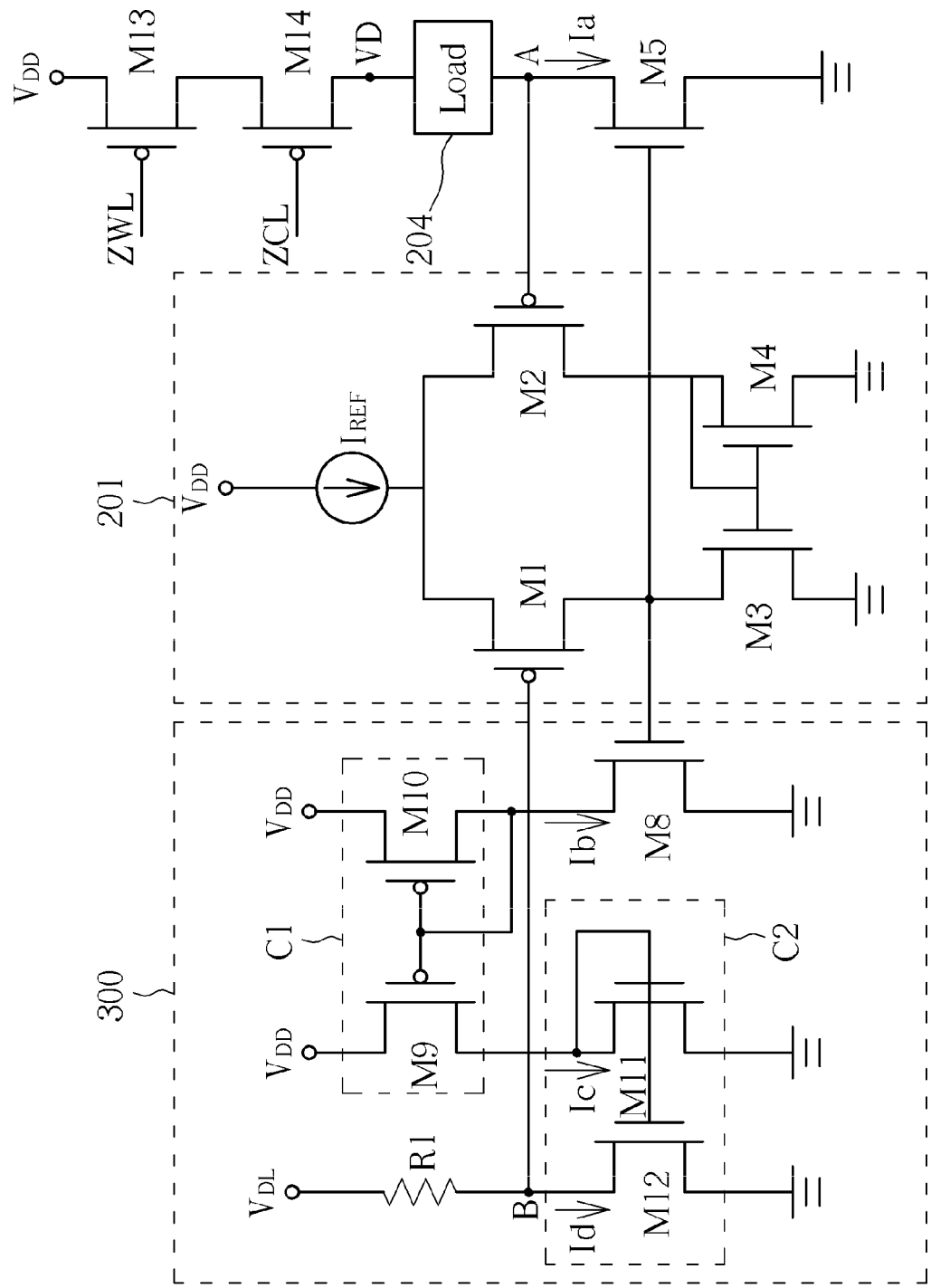
FIG. 3 is an embodiment of the operational amplifier and the compensating circuit according to the present invention.

Please refer to FIG. 3. FIG. 3 is an embodiment of the operational amplifier 201 and the compensating circuit 300 according to the present invention. The operational amplifier 201 comprises four transistors M1, M2, M3, and M4. The transistors M1 and M2 are PMOS transistors. The transistors M3 and M4 are NMOS transistors. The drain of the transistor M1 is coupled to the gate of the transistor M5. The source of the transistor M1 is coupled to a current source IREF. The gate of the transistor M1 is coupled to the node B. The source of the transistor M2 is coupled to the current source IREF. The gate of the transistor M2 is coupled to the node A. The drain of the transistor M4 is coupled to the drain of the transistor M2. The source of the transistor M4 is coupled to the ground. The gate of the transistor M4 is coupled to the drain of the transistor M4. The drain of the transistor M3 is coupled to the drain of the transistor M1. The source of the transistor M3 is coupled to the ground. The gate of the transistor M3 is coupled to the gate of the transistor M4.

The compensating circuit 300 comprises a transistor M8, a first current mirror C1, a second current mirror C2, a reference voltage source VDL, and a resistor R1. The transistor M8 is an NMOS transistor. The drain of the transistor M8 is coupled to the first current mirror C1. The gate of the transistor M8 is coupled to the gate of the transistor M5. The source of the transistor M8 is coupled to the ground. The first current mirror C1 comprises two transistors M9 and M10. The transistors M9 and M10 are PMOS transistors. The drain of the transistor M10 is coupled to the drain of the transistor M8. The source of the transistor M10 is coupled to a voltage source VDD. The gate of the transistor M10 is coupled to the gate of the transistor M9. The source of the transistor M9 is coupled to the voltage source VDD. The drain of the transistor M9 is coupled to the second current mirror C2. The second current mirror C2 comprises two transistors M11 and M12. The transistors M11 and M12 are NMOS transistors. The drain of the transistor M11 is coupled to the drain of the transistor M9. The source of the transistor M11 is coupled to the ground. The gate of the transistor M11 is coupled to the drain of the transistor M11. The drain of the transistor M12 is coupled to a first end of the resistor R1. The source of the transistor M12 is coupled to the ground. The gate of the transistor M12 is coupled to the gate of the transistor M11.

The voltage drop is generated when the current passing through the bit line load 204. The voltage drop pulls down the voltage at the node A. The compensating circuit 300 can compensate the voltage drop. The voltage of the gate of the transistor M5 increases when the current Ia increases. The gate of the transistor M8 is coupled to the gate of the transistor M5, so the current Ib is equal to the current Ia. The drain of the transistor M8 is coupled to the first current mirror C1. The first current mirror C1 generates the first replicating current Ic according to the current Ib. The first current mirror C1 is coupled to the second current mirror C2. The second current mirror C2 generates the second replicating current Id according to the current Ic. Thus, the second replicating current Id varies with the current Ia. In this way, the reference voltage VDL is compensated by the second replicating current Id and the resistor R1. The node B is coupled to the gate of the transistor M1. The voltages of the gate of the transistor M1 and the transistor M2 are the same because of the virtual short between two input ends of the operational amplifier. Consequently, the voltage of the node B can trace the voltage of the node A. When the voltage of the node A increases, the voltage of the node B increases. When the voltage of the node A decreases, the voltage of the node B decreases. Therefore, the sense amplifier 200 can keep the voltage VD to a fixed value for varying cell current and increase the current margin when the data of the memory cell is read.

The node A is coupled to the negative input end of the comparator 202 for receiving the current of the bit line of the memory. The positive input end of the comparator 202 is coupled to the reference current source 203 for receiving the reference current Ir. The comparator 202 compares the reference current Ir and the current Ia. When the current Ia is higher than the reference current Ir, the comparator 202 outputs the logic "1". When the current Ia is lower than the reference current Ir, the comparator 202 outputs the logic "0".

According to the present invention, the gate of the transistor M5 is coupled to the compensating circuit 300 instead of the reference voltage source VDL. The compensating circuit 300 can generate a compensating voltage according to the drain current of the transistor M5 to keep the voltage VD to a fixed value. Thus, the sense amplifier 200 has a good current margin. Furthermore, the compensating circuit 300 is coupled between the gate and the drain of the transistor M5 to form a negative feedback loop so as to increase the stability of the sense amplifier 200. The embodiment of the present invention is illustrated by the PMOS memory cells. However, the compensating circuit according to the present invention can be used in the NMOS memory cells.

In conclusion, the sense amplifier according to the present invention can compensate the voltage drop of the bit line load. The sense amplifier comprises a transistor, an operational amplifier, and a compensating circuit. The negative input end of the operational amplifier is coupled to the compensating circuit. The positive input end of the operational amplifier is coupled to the drain of the transistor. The output end of the operational amplifier is coupled to the gate of the transistor. The compensating circuit is coupled between the negative input end and the output end of the operational amplifier. The compensating circuit generates a compensating voltage to the negative input end of the operational amplifier according to the voltage of the gate of the transistor. Thus, the voltage drop of the bit line load is compensated.

Those skilled in the art will readily observe that numerous modifications and alterations of the device and method may be made while retaining the teachings of the invention.

What is claimed is:

1. A sense amplifier for a memory comprising:
   a first transistor having a first end coupled to a bit line of the memory, a second end coupled to a first voltage terminal, and a control end;
   an operational amplifier having a first input end, a second input end coupled to the first end of the first transistor, and an output end coupled to the control end of the first transistor; and
   a compensating circuit coupled between the first input end and the output end of the operational amplifier, for generating a compensating voltage to the first input end of the operational amplifier according to a voltage of the control end of the first transistor, wherein the compensating circuit comprising:
   a first NMOS transistor having a drain, a source coupled to the ground, and a gate coupled to the output end of the operational amplifier;
   a first current mirror coupled to the drain of the first NMOS transistor for generating a first replicating current of bit line of the memory;

a second current mirror coupled to the first current mirror for generating a second replicating current of bit line of the memory; and
a resistor having a first end coupled to the second current mirror, and a second end coupled to a reference voltage source.

2. The sense amplifier of claim 1, wherein the first transistor is an NMOS transistor, a drain of the NMOS transistor coupled to the bit line of the memory, a source of the NMOS transistor coupled to a ground, and a gate of the NMOS transistor coupled to the output end of the operational amplifier.

3. The sense amplifier of claim 2, wherein the operational amplifier comprises:
a first NMOS transistor having a drain, a source coupled to the ground, and a gate coupled to the drain of the first NMOS transistor;
a first PMOS transistor having a drain coupled to the drain of the first NMOS transistor, a source coupled to a current source, and a gate coupled to the bit line of the memory;
a second PMOS transistor having a drain coupled to the control end of the first transistor, a source coupled to the current source, and gate coupled to the compensating circuit; and
a second NMOS transistor having a drain coupled to the drain of the second PMOS transistor, a source coupled to the ground, and a gate coupled to gate of the first NMOS transistor.

4. The sense amplifier of claim 2, wherein a voltage of the gate of the first transistor increases when a current of the bit line of the memory increases.

5. The sense amplifier of claim 2, wherein the compensating circuit coupled between the first input end and the output end of the operational amplifier forms a negative feedback loop so as to increase the stability of the sensing amplifier.

6. The sense amplifier of claim 1 further comprising:
a reference current source; and
a second transistor having a first end coupled to the reference current source, a second end coupled to the first voltage terminal, and a control end coupled to the control end of the first transistor.

7. The sense amplifier of claim 6 further comprising:
a comparator having a first input end coupled to the second input end of the operational amplifier, a second input end coupled to the reference current source, and an output end.

8. The sense amplifier of claim 1, wherein the bit line of the memory comprises effective impedance on the bit line decoding paths.

9. The sense amplifier of claim 1, wherein the first current mirror comprises:
a first PMOS transistor having a drain coupled to the drain of the first NMOS transistor, a source coupled to a voltage source, and a gate coupled to the drain of the first NMOS transistor;
a second PMOS transistor having a drain, a source coupled to the voltage source, and a gate coupled to the gate of the first PMOS transistor; and
the second current mirror comprises:
a second NMOS transistor having a drain coupled to the drain of the second PMOS transistor, a source coupled to the ground, and a gate coupled to the drain of the second PMOS transistor; and
a third NMOS transistor having a drain coupled to the first input end of the operational amplifier, a source coupled to the ground, and a gate coupled to the gate of the second NMOS transistor.

10. A sense amplifier for a memory comprising:
an NMOS transistor having a drain of the NMOS transistor coupled to a bit line of the memory, a source of the NMOS transistor coupled to a ground, and a gate;
an operational amplifier comprising:
a first input end;
a second input end coupled to the drain of the NMOS transistor;
an output end coupled to the gate of the NMOS transistor;
a first NMOS transistor having a drain, a source coupled to the ground, and a gate coupled to the drain of the first NMOS transistor;
a first PMOS transistor having a drain coupled to the drain of the first NMOS transistor, a source coupled to a current source, and a gate coupled to the bit line of the memory;
a second PMOS transistor having a drain coupled to the control end of the first transistor, a source coupled to the current source, and gate coupled to the compensating circuit; and
a second NMOS transistor having a drain coupled to the drain of the second PMOS transistor, a source coupled to the ground, and a gate coupled to gate of the first NMOS transistor; and
a compensating circuit coupled between the first input end and the output end of the operational amplifier, for generating a compensating voltage to the first input end of the operational amplifier according to a voltage of the gate of the NMOS transistor.

11. A sense amplifier for a memory comprising:
an NMOS transistor having a drain of the NMOS transistor coupled to a bit line of the memory, a source of the NMOS transistor coupled to a ground, and a gate;
an operational amplifier having a first input end, a second input end coupled to the drain of the NMOS transistor, and an output end coupled to the gate of the NMOS transistor; and
a compensating circuit coupled between the first input end and the output end of the operational amplifier forming a negative feedback loop to increase the stability of the sensing amplifier and for generating a compensating voltage to the first input end of the operational amplifier according to a voltage of the gate of the NMOS transistor.

* * * * *